(12) United States Patent
Koo et al.

(10) Patent No.: US 8,461,558 B2
(45) Date of Patent: Jun. 11, 2013

(54) SYSTEM AND METHOD FOR ION IMPLANTATION WITH DUAL PURPOSE MASK

(75) Inventors: Bon-Woong Koo, Andover, MA (US); Richard M. White, Newmarket, NH (US); Kevin M. Daniels, Lynnfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 171 days.

(21) Appl. No.: 13/175,494

(22) Filed: Jul. 1, 2011

(65) Prior Publication Data

US 2013/0001440 A1    Jan. 3, 2013

(51) Int. Cl.
*A61N 5/00* (2006.01)
*G21G 5/00* (2006.01)

(52) U.S. Cl.
USPC ............. 250/492.3; 250/492.2; 250/492.22; 250/397; 250/398

(58) Field of Classification Search
USPC ............. 250/492.3, 492.2, 492.22, 397, 398
See application file for complete search history.

(56) References Cited

U.S. PATENT DOCUMENTS

| | | | |
|---|---|---|---|
| 5,911,832 A * | 6/1999 | Denholm et al. | 118/723 E |
| 6,632,482 B1 | 10/2003 | Sheng | |
| 6,930,316 B2 * | 8/2005 | Nishihashi et al. | 250/492.21 |
| 7,279,687 B2 * | 10/2007 | Angel et al. | 250/396 R |
| 2006/0258128 A1 * | 11/2006 | Nunan et al. | 438/510 |
| 2010/0255683 A1 | 10/2010 | Godet et al. | |
| 2010/0323508 A1 | 12/2010 | Adibi et al. | |

* cited by examiner

*Primary Examiner* — Nikita Wells
*Assistant Examiner* — Meenakshi Sahu

(57) ABSTRACT

A system for implanting a substrate. The system includes a substrate holder disposed within a process chamber of the system and coupled to ground. The system also includes an electrode disposed within the process chamber and coupled to a power source, the power source configured to supply voltage to the electrode as an unbalanced voltage pulse train, wherein a negative peak voltage during a negative voltage pulse period of the unbalanced voltage pulse train is higher than a positive peak voltage during a positive voltage pulse period of the unbalanced pulse train. The system further includes a movable mask, wherein the movable mask is configured to move between a first position proximate the substrate holder, and a second position proximate the driven electrode.

21 Claims, 5 Drawing Sheets

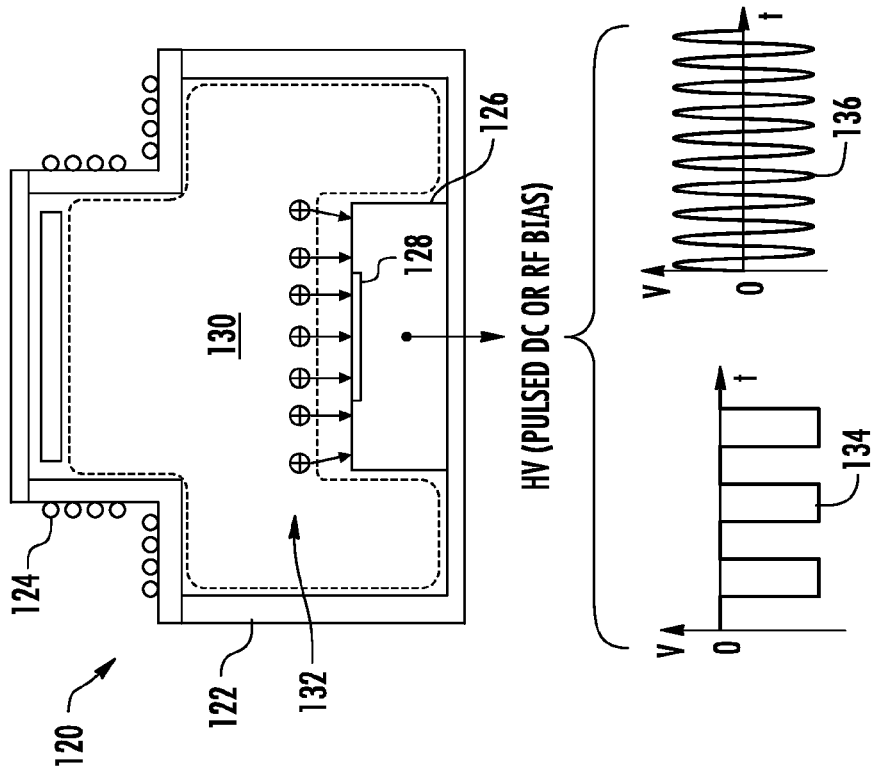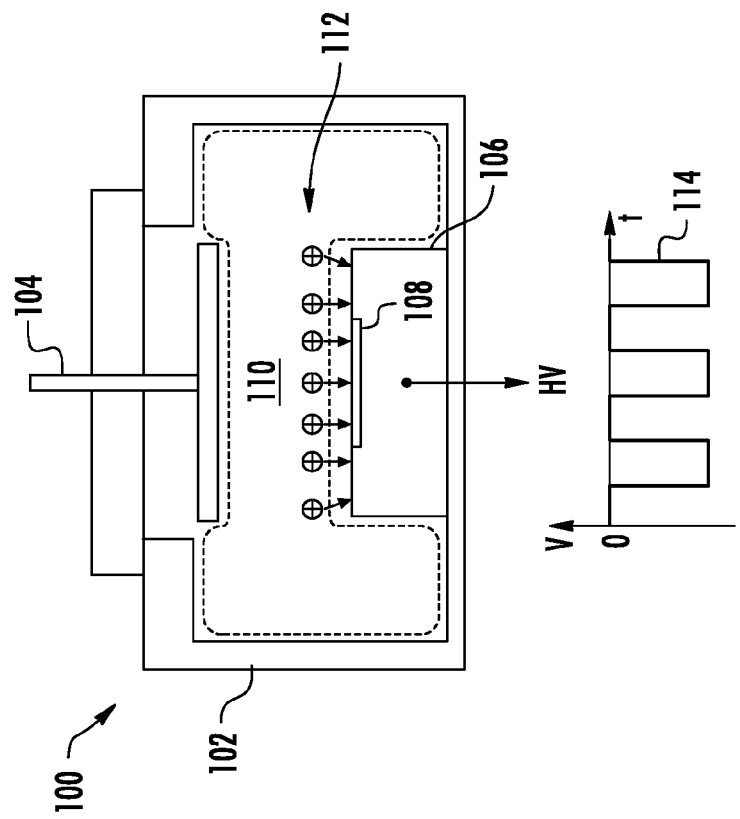

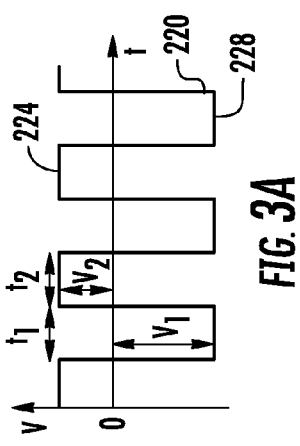
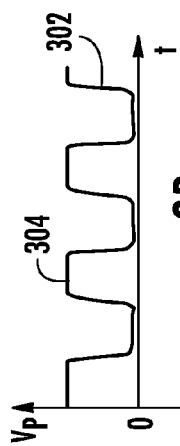
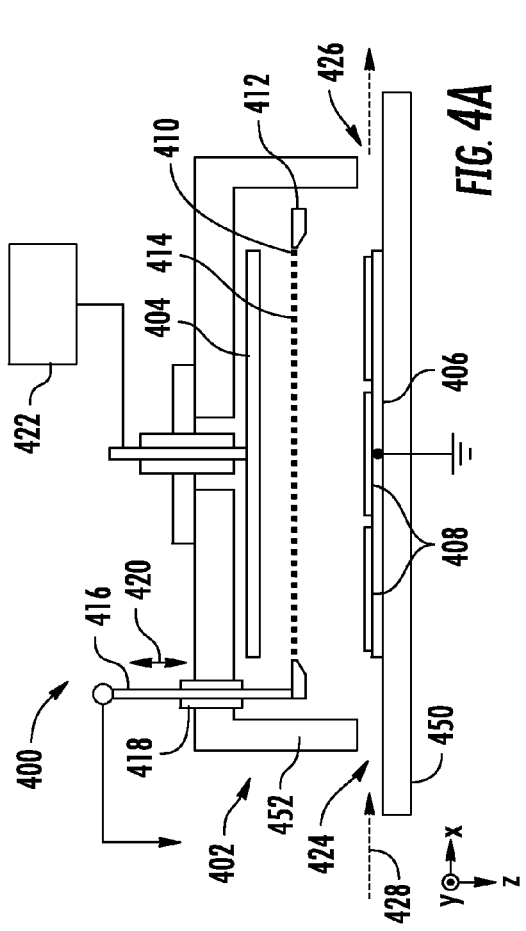
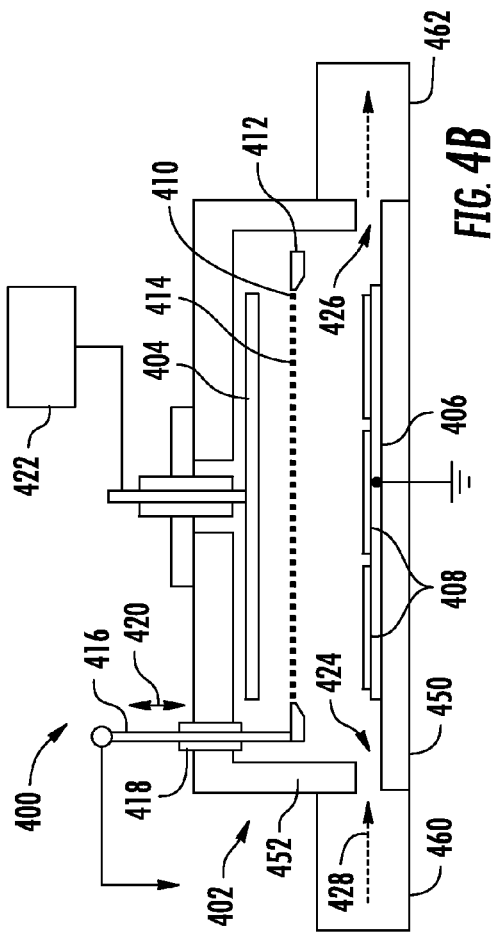

SYSTEM AND METHOD FOR ION IMPLANTATION WITH DUAL PURPOSE MASK

FIELD

The present disclosure relates to ion beams. More particularly, the present disclosure relates to producing an ion beam within ion implantation systems.

BACKGROUND

For many applications, such as formation of solar cells using ion implantation, the ability to implant at high current in an efficient manner is needed to reduce production costs. Large area sources may have various configurations.

Known beamline implanters may include an ion source, extraction electrodes, a mass analyzer magnet, corrector magnets, and deceleration stages, among other components. The beamline architecture provides a mass analyzed beam such that ions of a desired species are conducted to the substrate (workpiece). However, one disadvantage of the beamline implanter architecture is that the implantation current and therefore the throughput may be insufficient for economical production in applications such as implantation of solar cells.

Plasma doping tools (PLAD) may provide a more compact design that is capable of producing higher beam currents at a substrate. In a PLAD tool, a substrate may be immersed in a plasma and provided with a bias with respect to the substrate to define the ion implantation energy. This provides the potential for higher beam current, which reduces the time needed to perform an implant. However, one drawback of PLAD systems stems from the need to introduce and purge gas into the system. Initially, the gas pressure inside the process chamber may be in the milliTorr (mTorr) range, while after processing, the process chamber pressure may be required to be less than $10^{-4}$ Torr before unloading the substrates. This adds significantly to the cycle time for processing a substrate even when the actual duration of ion implantation is relatively short.

Many present-day applications require not only high throughput but low ion energy. In order to achieve this, typical PLAD systems employ a plasma source, which may be an RF or DC source, and a separate power supply used to independently bias the substrates to be implanted with respect to the plasma. The bias power may be supplied as pulsed DC bias, as an RF bias, etc., in known systems. Although less complex apparatus have been developed for high throughput ion implantation, such as glow discharge DC PLAD (GD PLAD) tools, the latter are not ideally suited for providing low energy, high density plasmas. In the GD PLAD method, a single pulsed-DC wafer bias is applied to a process chamber for both plasma generation and for biasing the substrate to cause ion implantation. However, the low bias-voltage typically cannot generate high-density, uniform plasmas over the substrate region for high-throughput.

FIGS. 1a and 1b show a comparison of known GD PLAD and RF PLAD systems. In GD PLAD system 100, an anode 104 is grounded and a negative voltage DC pulse 114 is applied to a workpiece (substrate) holder 106 and generates a plasma 110, while at the same time supplying a bias to substrate 108 with respect to plasma 110 in order to attract ions 112 for implantation. The implant uniformity can be optimized by adjusting the operating pressure and the physical gap between the wafer and anode. This approach works relatively well at high voltages suitable for high energy ion implantation, but does not work well at low energies, e.g. <3 keV), because of the low plasma density generated at such low voltages, and does not work at all below the Paschen curve.

The RF PLAD system 120, in contrast, employs an external plasma source 124 to independently generate a plasma 130. In this case, the substrate holder 126 and substrate 128 are biased at negative potential using a separate voltage supply (not shown) that supplies a pulsed DC bias 134 or RF bias 136, so as to attract ions 132 for implantation into substrate 128. Because the plasma 130 is generated by plasma source 124, the plasma density can be maintained at a high level even if a low bias voltage is supplied to substrate holder 126, since the ionization of plasma species is not primarily dependent on the voltage applied to the substrate holder, as is the case in GD PLAD system 100. While the RF PLAD system affords the ability to generate high density plasmas at low ion energy, system complexity and expense are undesirable. In addition, known GD PLAD and RF PLAD systems such as systems 100 and 120 do not provide a means for patterned implantation to be performed on workpieces. In view of the aforementioned drawbacks, it will therefore be apparent that a need exist to improve PLAD type ion implantation systems, especially in the case of high throughput low energy ion beams.

SUMMARY

Embodiments of the present disclosure are directed to low energy ion implanters that include a high throughput capability. In one embodiment, a system for implanting a substrate includes a substrate holder disposed within a process chamber of the system and being coupled to ground. The system also includes an electrode disposed within the process chamber and coupled to a power source, the power source configured to supply voltage to the electrode as an unbalanced voltage pulse train, wherein a negative peak voltage during a negative voltage pulse period of the unbalanced voltage pulse train is higher than a positive peak voltage during a positive voltage pulse period of the unbalanced pulse train. The system further includes a movable mask, wherein the movable mask is configured to move between a first position proximate the substrate holder, and a second position proximate the anode.

In another embodiment, a method of implanting a substrate in a plasma chamber of an ion implantation system comprises coupling a substrate holder disposed in the plasma chamber to ground, providing from a power supply an unbalanced voltage pulse train to an electrode disposed in the plasma chamber, and positioning a mask during a first exposure proximate the substrate, wherein the mask is coupled to ground.

BRIEF DESCRIPTION OF THE DRAWINGS

For a better understanding of the present disclosure, reference is made to the accompanying drawings, which are incorporated herein by reference and in which:

FIGS. 1a and 1b show a comparison of known GD PLAD and RF PLAD systems, respectively;

FIGS. 3a-3c show exemplary details that illustrate the relation of applied voltage, plasma potential and ion energy in an exemplary system;

FIG. 4a depicts one embodiment of an ion implantation system that provides for patterned ion implantation;

FIG. 4b depicts another embodiment of an ion implantation system that provides for patterned ion implantation;

DETAILED DESCRIPTION

Figure 2A:
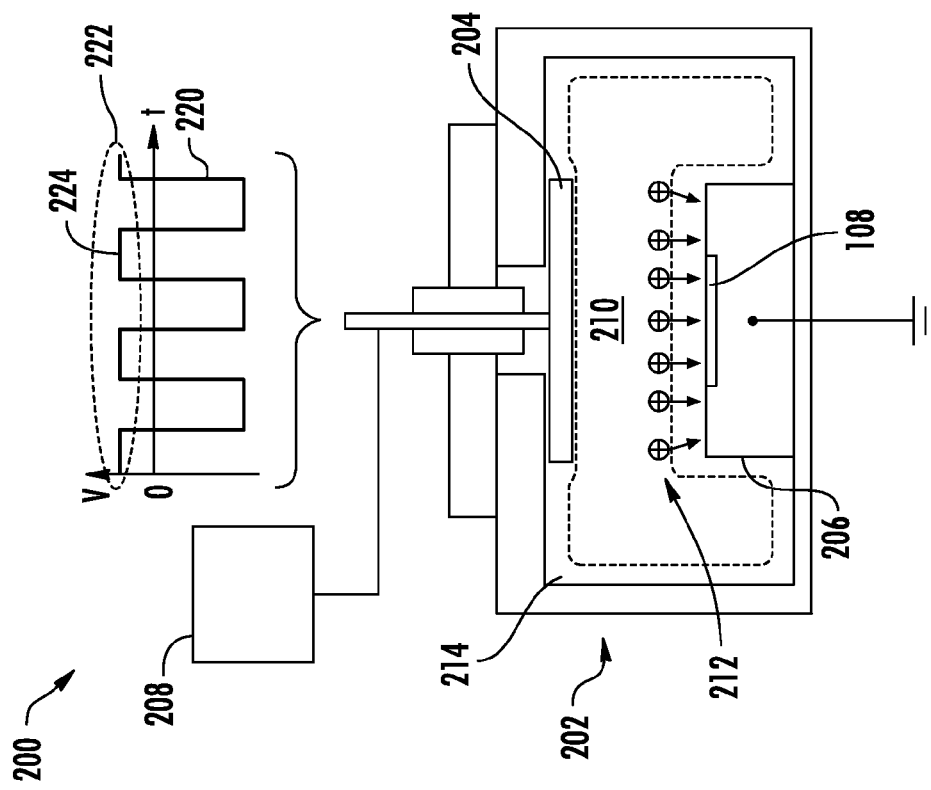
FIGS. 2a and 2b depict general features of a system for implanting a substrate consistent with embodiments of this disclosure.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

In various embodiments of the disclosure a system and method are set forth for low energy high throughput ion implantation. The ions used in the present embodiments may be a p-type dopant, an n-type dopant, hydrogen, a noble gas, or other species known to those skilled in the art. As noted, previous plasma based ion implantation systems, such as PLAD tools, have addressed the problem of providing high throughput at low ion energy by equipping a PLAD system with both a plasma source to create a plasma and a power supply to provide bias to a substrate to define the implantation energy. However, such systems may require complex hardware to isolate a substrate pedestal from ground, and substrate handling issues may interfere with high throughput operation. In addition, such systems may require unacceptably long gas loading and gas pumping time before and after ion implantation, as mentioned above.

Figure 2B:
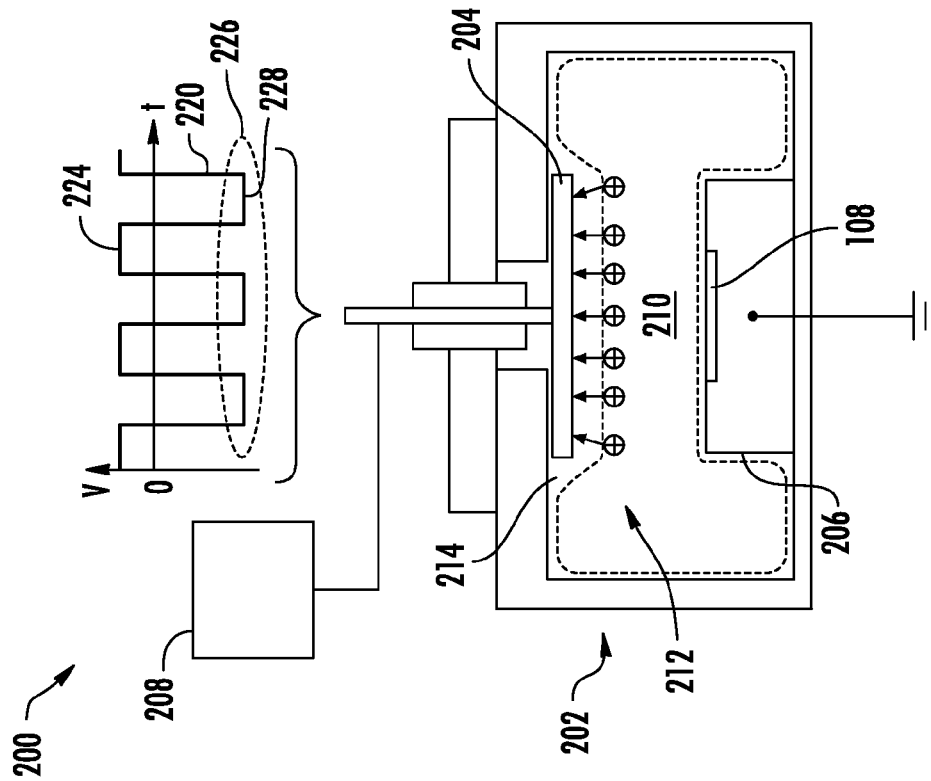

In the present embodiments, novel apparatus and methods provide for low energy ion implantation using high density plasmas in which the substrate is processed at ground potential, thereby avoiding drawbacks of prior art equipment. In various embodiments, both masked and blanket implantation can be performed in a high throughput low ion energy configuration. FIGS. 2a and 2b depict general features of a system 200 for implanting a substrate consistent with embodiments of this disclosure. System 200 includes a process chamber 202 that contains a driven electrode 204 and substrate holder 206. In the embodiment depicted in FIG. 2, the driven electrode 204 and substrate holder 206 are disposed opposite one another although in other embodiments the substrate holder 206 need not be opposite the driven electrode 204. For example, embodiments in which a system includes multiple driven electrodes located at different positions within a process chamber are contemplated. As illustrated in the FIG. 2, the driven electrode 204 is configured to receive a voltage signal from power source 208, which signal provides a high voltage that is sufficient to produce and sustain the high density plasma 210. In some embodiments, the voltage signal may be a bias voltage pulse train 220, which alternates between positive portions 222 and negative portions 226. More particularly, in embodiments of a square wave pulse train, the voltage signal comprises a series of alternating negative and positive voltage pulses in which the positive peak 224 and negative peak 228 are flat. Accordingly, for the entire periods of respective positive and negative peaks 224 and 228, the applied voltage to driven electrode 204 is constant. As further depicted in FIGS. 2a, 2b the voltage signal may be provided as an unbalanced voltage pulse train, wherein the absolute value of the negative peak 228 is greater than the absolute value of the positive peak 224.

Referring also to FIG. 3a, the configuration in FIG. 2a depicts the state of system 200 during negative voltage pulse periods $t_1$ when the applied voltage to driven electrode 204 is negative. In various embodiments, the negative voltage $V_1$ is sufficient to ignite and maintain high-density plasma 210. For example, $V_1$ may range from about 2 kV to about 20 kV, and more particularly may be about 3 kV to about 10 kV. As shown, a plasma sheath 214 forms between high density plasma 210 and driven electrode 204. Positive ions 212 may be created in high density plasma 210 and attracted across plasma sheath toward driven electrode 204. The positive ions 212 may include those species intended for implantation into substrate 108. However, during $t_1$, positive ions 212 are not implanted into substrate 108 because the plasma potential remains slightly above ground potential, as detailed below with respect to FIG. 3. The ground potential at substrate 108 is therefore insufficient to induce significant implantation into substrate 108.

During the positive voltage pulse periods $t_2$ illustrated at FIG. 2b, the potential at driven electrode 204 is positive, thereby driving the plasma potential to a positive voltage slightly in excess of the electrode potential. In these periods, positive ions 212 are attracted from high density plasma 210 with sufficient energy to implant into substrate 108. Thus, the bias voltage pulse train 220 produces periods in which implantation takes place into substrate 108, that are separated by periods in which no implantation takes place.

FIGS. 3a-3c illustrate exemplary details of the relation of applied voltage, plasma potential and ion energy to the substrate 108 in system 200. In particular, FIG. 3a illustrates some parameters associated with the bias voltage pulse train 220 and the corresponding plasma potential curve 302 is illustrated in FIG. 3b. As is evident, the plasma potential $V_p$ tracks the positive voltage $V_2$ of bias voltage pulse train 220 during positive voltage pulse periods $t_2$. As is well known, the plasma potential represents the highest potential in a plasma processing system and accordingly is driven to a positive value at peaks 304 that is slightly in excess of $V_2$ during positive voltage pulse periods $t_2$. During the negative voltage pulse periods $t_1$, however, since the substrate holder 206 is grounded, the chamber walls of process chamber 202 (which are at ground potential) and substrate holder 206 both act as an anode and the plasma potential $V_p$ is accordingly pinned at a slightly positive value. The value of $V_p$ during $t_1$ may be about +5 to +30V for example.

As illustrated in FIG. 3c, which depicts the ion energy at substrate 108, the ion energy curve 310 closely tracks $V_p$ at all times since the positive ions 212 in high density plasma 210 are accelerated from a potential $V_p$ to the substrate potential, which is zero. In embodiments in which positive ions 212 are all singly ionized species, the value of ion energy $E_i$ in eV is equivalent to the value of $V_p$ in volts, assuming that plasma sheath 214 is a collisionless sheath which holds for most implantation conditions, where the gas pressure of the plasma during processing is less than about 100 mTorr.

Consistent with various embodiments, the parameters $V_1$, $V_2$, $t_1$, and $t_2$ are tailored to provide uniform ion implantation with high ion currents at a desired implantation energy. For example, for a 1 keV ion implantation process, the 1 kV voltage supplied during the positive voltage pulse period $t_2$ may in of itself be insufficient to achieve the plasma density needed to produce a current of positive ions 212 required for high throughput. Accordingly, in some embodiments, $V_1$ may be set at 5 kV or even higher voltages because the plasma density produced in negative voltage pulse period $t_1$ at 5 kV may result in a plasma density that meets the ion current requirement. In order to ensure that sufficient ion current remains for ion implantation during positive voltage pulse periods $t_2$, the duration of $t_2$ may chosen to limit the plasma decay. In particular, since the ion density of high density plasma 210 may decay when the sheath voltage drops from 5 kV in negative voltage pulse period $t_1$ to 1 kV in positive voltage pulse period $t_2$, the duration of $t_2$ may be limited to a predetermined time that prevents the plasma density from decaying below a threshold value.

In some embodiments, $t_2$ is in the range of 10-100 μs, and more particularly in the range of 10-50 μs. In studies of pulsed plasma behavior it has been observed that the plasma density remains at about 50% of its peak value even after 100 μs has elapsed from when the pulse is extinguished. Accordingly, in the present embodiments, setting $t_2$ to duration in the range of 10-50 μs, the plasma density $D_2$ during $t_2$ may decay substantially less than 50% from the plasma density $D_1$ during $t_1$, thus providing high enough ion density during actual implantation, resulting in high substrate throughput.

It is to be noted that the present embodiments provide flexibility in tuning an ion implantation process for a required ion implantation energy. For example, since the ion implantation only takes place during the periods $t_2$, the duty cycle for implantation $t_2/(t_1+t_2)$ may help define the ion implantation dose rate. For a 50% duty cycle where $t_1=t_2$, the duration of $t_2$ may be chosen to optimize implantation. For example, if $t_2$ is too long, the plasma 110 may experience excessive decay or may extinguish for very low values of $V_2$. If $t_2$ is too short, on the other hand, the overall throughput will be reduced due to shortened net implant time.

In various embodiments, a plasma based low energy ion implantation system includes capability for both blanket and patterned ion implantation in a high throughput fashion. FIG. 4a depicts a system 400 according to one embodiment of an ion implantation system that provides for patterned ion implantation. System 400 includes a process chamber 402 and a driven electrode 404 for creating a plasma and providing a desired implantation energy, as described hereinabove with respect to FIGS. 2 and 3. In particular, power source 422 is configured to supply a bias voltage pulse train, which may be an unbalanced bias pulse as depicted at FIG. 3a. Disposed opposite driven electrode 404 is a substrate holder 406, which supports substrates 408 and may be electrically grounded.

Disposed between substrate holder 406 and driven electrode 404 is a movable mask 410, which may include a removable mask plate 414 and frame 412. In various embodiments the frame 412 may be arranged as a "picture frame" structure wherein the frame 412 (picture frame) has a central aperture configured to accommodate the mask plate 414 (picture). For example, in some embodiments the edge of the mask plate 414 may be placed on the frame 412 or attached to the frame 412. Movable mask 410 is connected to a movable shaft 416, which is slidably disposed within a sleeve 418 so that movable shaft 416 can move along the direction 420.

In various embodiments, the movable mask 410 is operable to move from positions proximate substrates 408 to positions proximate driven electrode 404. As described in detail below, this facilitates the ability to perform both patterned ion implantation and blanket ion implantation in a manner consistent with low ion energy and high throughput operation.

In some embodiments multiple shafts are attached to movable mask 410 to increase the mechanical stability of the mask and to facilitate precise alignment between movable mask 410 and substrates 408. In further embodiments, the movable shaft 416 may be fed into process chamber 402 through the bottom portion 450 of process chamber 402. The movable shaft 416 may be disposed away from a region of the process chamber 402 where substrates are fed into chamber 402 and/ or extracted from chamber 402 so as not to interfere with transfer of substrates 408 into and out of the chamber. In still another embodiment, movable shaft 416 may be located within a sidewall 452 the chamber, for example, within a vertical slot (not shown) so that the exposure of the movable shaft 416 to the plasma chemistry is minimized during ion implantation.

In various embodiments, during patterned ion implantation the movable mask 410 is configured to electrically couple to ground, while during blanket ion implantation, the movable mask 410 is configured to couple to power source 422. In this manner, the movable mask 410 assumes the proper potential so as to facilitate patterned ion implantation on the one hand, and to provide stable operation during blanket ion implantation on the other hand.

In some embodiments, system 400 is provided with portals 424, 426, which may allow substrates 408 to be moved into and out of process chamber 402 through portals 424 and 426 respectively without opening/closing portals 424, 426. In some embodiments, a linear transport system (not shown) may move the substrates 408 into process chamber 402 and onto substrate holder 406 along the direction 428. Because substrate holder 406 is not coupled to a high voltage signal, many different known configurations of substrate holders 406 and substrate transport devices are possible.

Moreover, in various embodiments, the portals 424 and 426 may be configured to provide a limited gas conductance through portals 424 and 426, thereby allowing a more continuous operation of system 400. FIG. 4b depicts an embodiment of system 400 including entrance load lock chamber 460 and exit load lock chamber 462. Substrates 408 may be loaded into entrance load lock chamber 460 at a high pressure, such as ambient pressure, and transported along direction 428 into process chamber 402. In some embodiments, isolation valves (not shown) may be provided between the entrance load lock chamber 460 and process chamber 402, as well as between and exit load lock chamber 462 and process chamber 402. The entrance and exit load lock chambers 460, 462, respectively, may also each be provided with a separate pump to allow evacuation of the load lock chambers independently of the process chamber 402.

In operation, the entrance load lock chamber 460 may be isolated from process chamber 402 through use of an isolation valve and may be brought to atmospheric pressure to load multiple substrates 408. In some embodiments, substrate holder 406 may be a movable platen, upon which a matrix of substrates 408 is loaded in entrance load lock chamber 460. For example, substrate holder may support a 1×3 or a 2×3 matrix of substrates 408 in alternative embodiments. The entrance load lock chamber 460 may be configured to accommodate dozens of substrate holders 406 such that hundreds of substrates 408 may be loaded onto each substrate holder 406 in load lock chamber. In this regard, it is to be noted that both entrance load lock chamber 460 and exit load lock chamber 462 may be larger than process chamber 402. After loading, the entrance load lock chamber 460 may be evacuated to low pressure, after which an isolation valve is opened to allow substrates 408 to be loaded into process chamber 402. Once an isolation valve is opened, the portal 424 (as well as portal 426) may remain open so that substrates 408 may be continually transported into and out of process chamber 402 in the direction 428. In this manner, many dozens or hundreds of substrates 408 may be processed in a continuous fashion. Once a group of substrates 408 is processed, entrance load lock chamber 460 and exit load lock chamber 462 may be isolated from process chamber 402 to allow for loading additional substrates 408 and/or unloading processed substrates 408 without disturbing process chamber 402.

Figure 4C:
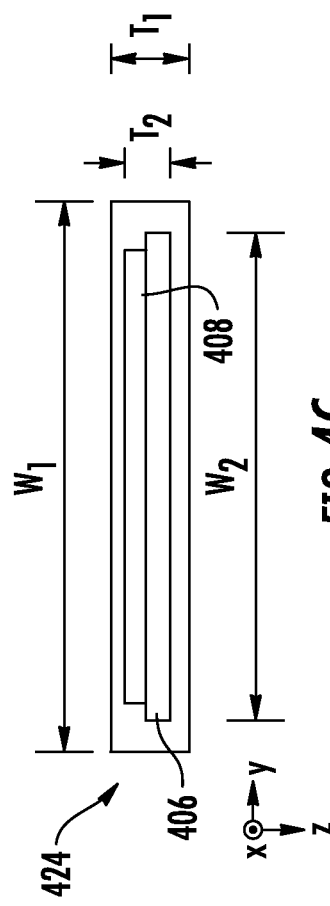
FIGS. 4c and 4d depict exemplary details of portals in an ion implantation system in side view and front view, respectively.
Figure 4D:
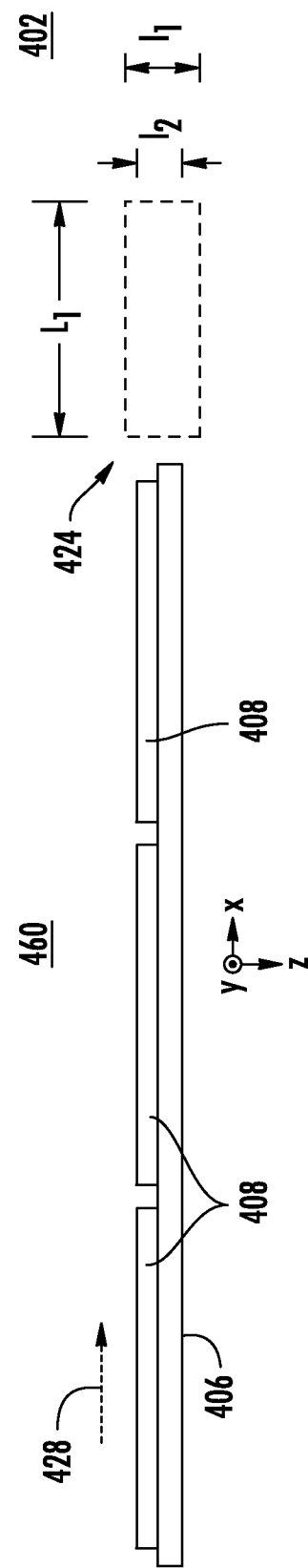

Referring also to FIGS. 4c and 4d, there are shown mutually orthogonal views of portal 424 and a substrate 408 in accordance with one embodiment. In the side view of FIG. 4c, the perspective is along the x direction as defined by the coordinate system depicted therein. In the embodiment shown, the portal 424 is configured to accommodate a matrix of 1×3 substrates 408 that are positioned on substrate holder 406. The height $T_1$ of the portal 424 is slightly larger than the combined thickness $T_2$ of substrates 408 and substrate holder 406 to allow for the substrate 408 to be transported through the portal 424 when oriented as shown. Similarly, the width $W_1$ of portal 424 is slightly larger than the width $W_2$ of substrate holder 406. Thus the total cross-section ($=W_1 \times T_1$) of portal 424 may be minimized to minimum dimensions necessary to conveniently accommodate substrate 408 loading in order to reduce gas conductance.

As depicted in the front view of FIG. 4d, whose perspective is along the y direction, the length $L_1$ of the portal 424 may be configured to be sufficiently long to further minimize gas conductance through portal 424 between process chamber 402 and entrance load lock chamber 460.

Because portal 424 may have a limited conductance, a large pressure difference between the process chamber 402 and the entrance loadlock chamber 460 may be produced so that a low pressure consistent with the plasma operating requirements may be maintained in process chamber 402 even when entrance load lock chamber 460 is at a higher pressure or at a lower pressure than process chamber 402, or when pressure fluctuates within entrance load lock chamber 460. Similarly, portal 426 may be configured as depicted in FIGS. 4c and 4d, and may therefore support a large pressure differential between process chamber 402 and exit load lock chamber 462. This limited conductance may sustain in-line continuous processing of substrates 408, wherein substrates 408 are continuously loaded into process chamber 402, transported through process chamber 402, subjected to ion implantation, and unloaded from process chamber 402 without the need to extinguish/establish a plasma (not shown) between processing each substrate or group of substrates. This contrasts with known PLAD systems that require extra time for gas loading and pumping before and after the implantation process.

Figure 5A:
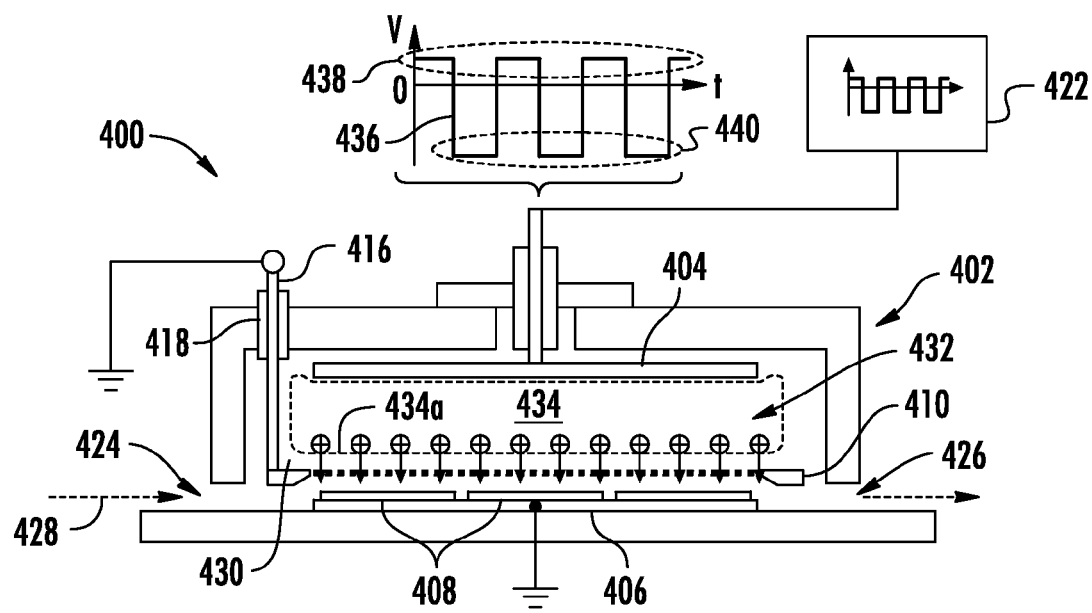
FIGS. 5a and 5b depict operation of the system of FIG. 4 during patterned ion implantation and blanket ion implantation, respectively.
Figure 5B:
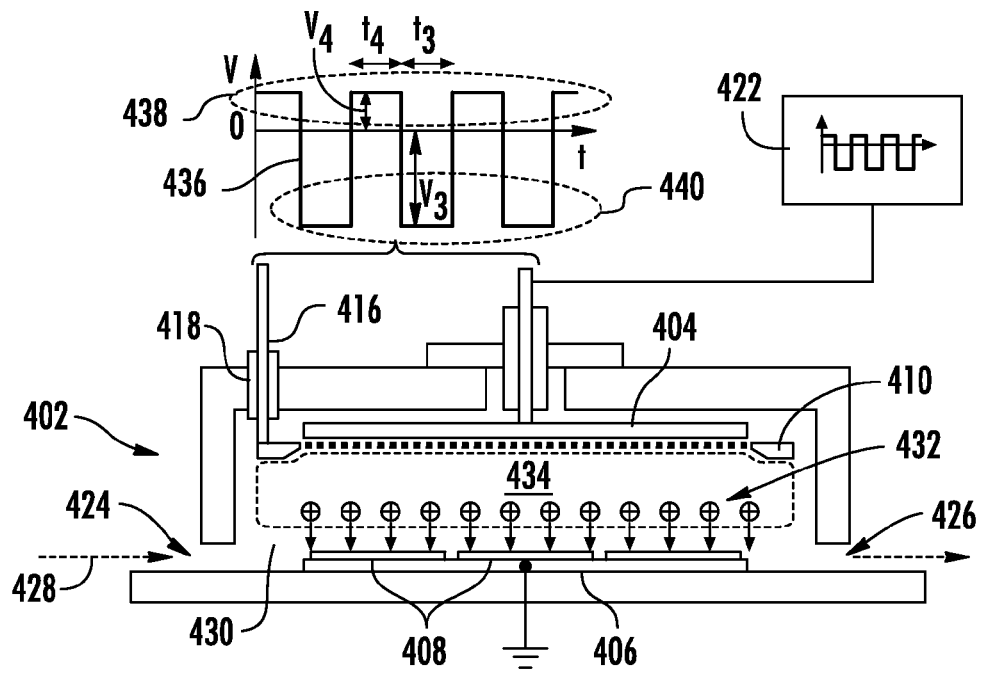

FIGS. 5a and 5b depict operation of system 400 during patterned ion implantation and blanket ion implantation, respectively. During patterned ion implantation, the movable mask 410 is positioned proximate substrates 408 so as to place openings in the mask close to those areas of the substrate 408 to be implanted. In particular, the movable mask 410 is positioned close to the substrate 408 and is connected to ground potential. In this configuration, positive ions 432 accelerated from plasma 434 may exit plasma sheath 430 at normal incidence to plasma sheath boundary 434a. The ions therefore pass through movable mask 410 at normal incidence so that the mask pattern is accurately transferred to substrate 408. In other words, the size and shape of areas of substrate 408 implanted with positive ions 432 matches that of apertures (not shown) in movable mask 410.

More particularly, FIG. 5a illustrates the situation during $t_4$ when a positive voltage pulse 438 of bias voltage pulse train 436 is applied to driven electrode 404. Because the substrate holder 406 is grounded, the plasma 434 is driven to a positive potential approximately equal to $V_4$, such that positive ions 432 accelerate through a sheath potential about equal to $V_4$. For the duration of negative voltage pulse period $t_3$ corresponding to negative voltage pulse 440 whose peak voltage is $V_3$, the potential at movable mask 410 and substrates 408 remains at zero (ground) and the plasma potential $V_p$ is slightly above ground so that positive ions 432 may be attracted towards movable mask 410 and substrates 408 through a voltage equal to $V_p$, which may a few volts or a few tens of volts. Accordingly, no appreciable implantation may take place.

In FIG. 5b, a configuration for blanket ion implantation using system 400 is depicted consistent with various embodiments. In this configuration, the movable mask 410 is positioned proximate driven electrode 404 and is electrically connected to power source 422. Thus, the movable mask 410 is driven at the same potential as driven electrode 404. The substrate holder is connected to ground and therefore subject to ion implantation for the duration of positive voltage pulse periods $t_4$ corresponding to positive voltage pulses 438, as described hereinabove and depicted explicitly in FIG. 5b. Because the movable mask 410 is positioned proximate driven target 404, it does not generally alter the shape of plasma sheath boundary 434a and therefore may not mask or alter the trajectory of positive ions 432 as they are accelerated across plasma sheath 430 and implanted into substrates 408.

In summary, the present embodiments provide multiple improvements for processing substrates in plasma based ion implantation systems. One advantage provided by the present embodiments is that the mask unload and load times may be minimized, thereby improving system throughput. For example, a series of blanket implants may be performed, followed by a series of patterned implants, followed by further blanket implants, and so forth, without having to access process chamber 402 to load or unload masks.

Moreover, when low energy patterned implantation is desired (below, for example, about 3 keV), the appropriate mask need only be connected to ground and positioned proximate the substrate to be implanted. This facilitates processing high volume products such as solar cell, which may require both blanket and patterned ion implantation at low ion energy. This is not readily possible in prior art systems in which the substrate may have to be separately biased at negative voltage to accomplish implantation at energies lower than about 3 keV.

Furthermore, even for higher ion energy ion implantation in the 5 keV to 10 keV range, where known GD PLAD systems may produce high current implantation, the present embodiments provide additional advantages. Because the portals of processing systems of the present embodiments may support a large pressure difference between a process chamber and loadlock chamber, in-line continuous processing of substrates is possible, thereby eliminating time consuming pumping and gas loading cycles.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for implanting a substrate, comprising:
a substrate holder disposed within a process chamber of the system and being electrically grounded;
a driven electrode disposed within the process chamber and coupled to a power source, the power source configured to supply voltage to the driven electrode as an unbalanced voltage pulse train, wherein a negative peak voltage during a negative voltage pulse period of the unbalanced voltage pulse train is the same as or higher than a positive peak voltage during a positive voltage pulse period of the unbalanced pulse train; and
a movable mask configured to move between a first position proximate the substrate holder, and a second position proximate the driven electrode.

2. The system of claim 1, wherein the unbalanced voltage pulse train comprises a square wave pulse train.

3. The system of claim 1, wherein the positive peak voltage is less than about 2 kV, and an absolute value of the negative peak voltage is greater than about 2 kV.

4. The system of claim 1, wherein the system is configured to couple the movable mask to ground under a first operating condition, and to couple the movable mask to the power source under a second operating condition.

5. The system of claim 4, wherein the movable mask is coupled to ground when in the first position, and coupled to the power source when in the second position.

6. The system of claim 1, wherein the negative voltage pulse period is about 10-100 µs, and wherein the positive voltage pulse period is about 10-50 µs.

7. The system of claim 1, wherein the movable mask comprises a frame having a central aperture configured to accommodate a mask plate.

8. The system of claim 1, wherein the movable mask comprises a shaft slidably disposed with respect to a linear feedthrough of the process chamber.

9. A method of implanting a substrate in a plasma chamber of an ion implantation system, comprising;
coupling a substrate holder disposed in the plasma chamber to ground;
providing from a power supply an unbalanced voltage pulse train to an electrode disposed in the plasma chamber; and
positioning a mask during a first exposure proximate the substrate, wherein the mask is coupled to ground.

10. The method of claim 9, further comprising positioning the mask during a second exposure proximate the driven electrode.

11. The method of claim 10, further comprising electrically coupling the mask to the unbalanced voltage pulse train during the second exposure.

12. The method of claim 10, wherein during the first exposure the mask is disposed within a plasma sheath region created by a positive voltage pulse period of the unbalanced voltage pulse train, the method further comprising:
positioning during the first exposure portions of the substrate on the substrate holder proximate the mask to receive a patterned implant; and
positioning portions of the substrate on the substrate holder during the second exposure to receive a blanket implant.

13. The method of claim 9, comprising providing the unbalanced voltage pulse train as a series of square wave pulses in which a positive peak voltage is the same as or less than an absolute value of a negative peak voltage of each of the square wave pulses.

14. The method of claim 9, further comprising providing a negative voltage pulse period of the unbalanced voltage pulse train of about 10-100 µs.

15. The method of claim 9, further comprising providing a positive voltage pulse period of the unbalanced voltage pulse train of about 10-50 µs.

16. The method of claim 13, wherein the positive peak voltage is less than about 2 kV and an absolute value of the negative peak voltage is greater than about 2 kV.

17. A system for implanting a substrate, comprising:
a process chamber having an electrode electrically coupled to a power source and a substrate holder electrically coupled to ground; and
a movable mask, wherein the movable mask is configured to move between a first position proximate the substrate holder and a second position proximate the electrode;
wherein the power source is configured to supply voltage to the electrode as an unbalanced voltage pulse train, wherein an absolute value of a negative peak voltage of the unbalanced voltage pulse train is equivalent to or higher than a positive peak voltage of the unbalanced voltage pulse train, and
wherein the system is configured to couple the movable mask to ground when in the first position, and to couple the movable mask to the power source when in the second position.

18. The system of claim 17, wherein a duration of a negative voltage pulse period is about 10-100 µs, and wherein a duration of a positive voltage pulse period is about 10-50 µs.

19. The system of claim 17, wherein the positive peak voltage is less than about 2 kV, and an absolute value of the negative peak voltage is greater than about 2 kV.

20. The system of claim 17, the process chamber further comprising first and second portals coupled to respective first and second load lock chambers, wherein gas conductance through the first and second portals is configured to provide continuous plasma operation when the first and second portals are open.

21. The system of claim 20, wherein the system is configured to continuously transport substrates from the first load lock chamber into the process chamber and therefrom to the second load lock chamber while a plasma is maintained in the process chamber.

* * * * *